SURFACE BARRIER INDIUM ARSENIDE TRANSISTOR

Filed Oct. 14, 1963

Carver A. Mead
INVENTOR.

BY His Attorneys.

Spensley & Horn 3,289,052
SURFACE BARRIER INDIUM ARSENIDE TRANSISTOR

Carver A. Mead, Pasadena, Calif., assignor to California Institute Research Foundation, Pasadena, Calif., a corporation of California Filed Oct. 14, 1963, Ser. No. 316,013
6 Claims. (Cl. 317—234)

This invention relates to transistors and more particularly to an improved surface barrier transistor.

Surface barrier transistors have been known to the semiconductor art for some time. Such devices are so named due to the fact that the interface of the transistor which performs the functions of emission and collection of useful current are located at the surface of a semiconductor crystal body which serves as a base. Such prior art devices were constructed of germanium as the semiconductor crystal.

One such prior art surface barrier transistor and a description of its manufacture may be found in "Proceedings of the I.R.E." of December 1953, in an article entitled "The Surface-Barrier Transistor," by W. E. Bradley. This prior art device comprises an N-type conductivity germanium crystal as the base of the transistor. Upon opposite faces of this crystal there are established a metal emitter electrode and a metal collector electrode. Such metal electrodes are produced by an electro-plating process.

All of such prior art surface-barrier transistors suffer from inadequate emitter efficiency; that is, with an N-type semiconductor crystal serving as a base region the emitter is required to inject a satisfactory high density of holes and in those instances where a P-type semiconductor serves as the base region, the emitter must be capable of injecting a satisfactorily high density of electrons into the base region.

In such prior art devices, typically employing germanium as the semiconductor crystal, due to the presence of surface states on the semiconductor surface, when a metal such as zinc is plated or otherwise deposited on the surface, the Fermi level at the surface contact assumes a position near the center of the forbidden band gap. The position of the Fermi level of the surface contact has been found to be independent of the doping level of the semiconductor crystal. It has also been found to be nearly independent of the metal used for a large number of metals.

Since the surface contact Fermi level is not very near either the conduction band or the valence band (it is near the center of the forbidden band gap) for most metal semiconductor combinations it is nearly impossible to employ such a surface barrier contact and achieve a reasonably high emitter efficiency for a surface barrier transistor.

Other disadvantages inherent in prior art surface barrier transistors of the character described are as follows. Due to the inherently poor emitter efficiency it was the usual practice to increase the base resistivity, thus, adversely affecting the frequency response and other electrical characteristics of the transistor, such as the current transfer ratio.

The present invention surface barrier transistor overcomes these and other disadvantages attendant with present art surface barrier transistors.

It is therefore a primary object of the present invention to provide an improved surface barrier transistor.

Yet, another object of the present invention is to provide a surface barrier transistor having an emitter efficiency which is substantially higher than that heretofore obtainable.

A further object of the present invention is to provide a surface barrier transistor having essentially no collector storage.

A still further object of the present invention is to provide a surface barrier transistor having a low saturation voltage and a high frequency response.

Yet a further object of the present invention is to provide a surface barrier transistor having a low base resistance without a sacrifice in emitter efficiency.

Yet another object of the present invention is to provide an improved semiconductor metal barrier.

The novel features which are believed to be characteristic of the invention, both as to its organization and method of operation, together with further objects and advantages thereof will be better understood from the following description considered in connection with the accompanying drawing in which a presently preferred embodiment of the invention is illustrated by way of example. It is to be expresssly understood, however, that the drawing is for the purpose of illustration and description only, and is not intended as a definition of the limits of the invention.

The present invention resides primarily in the discovery that a crystal of P-type conductivity indium arsenide together with a surface barrier electrode of a suitable metal results in a surface barrier having many advantages while overcoming most of the shortcomings attendant with prior art surface barrier junctions. Such barrier junctions are particularly useful in a surface barrier transistor, but may also be useful in laser diodes and double injection devices.

Figure 1:
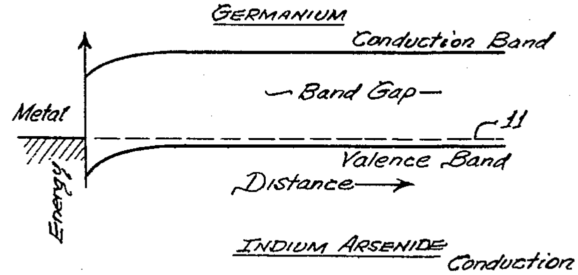
FIGURE 1 is an energy level diagram showing the barrier condition at the surface between a germanium semiconductor crystal body of P-type conductivity and a metal contact layer.
Figure 2:
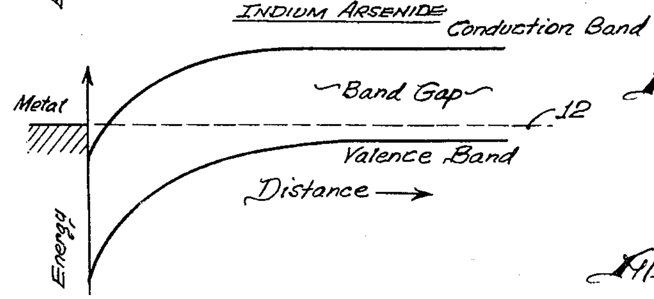
FIGURE 2 is an energy level diagram showing the barrier condition at the surface between an indium arsenide P-type semiconductor crystal body and a metal contact layer.

Indium arsenide is a semiconductor material and the only material known to the inventor in which the Fermi level at the surface lies either above the conduction band or below the valence band. Reference is now made to FIGURE 1 wherein there is shown an energy level diagram of a prior art germanium device. In this figure the abscissa indicates the distance into the crystal viewed from the metal contact barrier, while the ordinate indicates electron energy. Note that in FIGURE 1 the Fermi level 11 lies below the conduction band. This is typical of all group IV or III–V semiconductor materials except indium arsenide. With indium arsenide, as may readily be seen in FIGURE 2, the Fermi level 12 lies above the conduction band for a portion of the distance into the crystal. The discovery of this fact by the present inventor led him to the present invention design for an improved surface barrier transistor. Thus, the surface barrier metal electrode in indium arsenide results in a unique situation; one where the Fermi level at the interface lies within one of the allowed bands in the semiconductor crystal, and not in the forbidden band.

Thus, the surface Fermi level for all semiconductors (except indium arsenide) is not very near the conduction band or the valance band (in FIGURE 1 the closest distance to either of these is represented by the symbol $\phi bp$), it is nearly impossible to use such a surface barrier contact as an efficient emitter for a transmitter. However, indium arsenide has the remarkable property (as discovered by the inventor) that a suitable metal contact made upon its surface has the Fermi level of the metal actually above the conduction band edge of the indium arsenide crystal. Therefore, such a contact is of necessity an extremely efficient emitter of electrons. Thus, with a P-type conductivity indium arsenide base region, it is possible to generate a high level of minority carriers at the emitter, i.e., a high density of electrons. Hence, a highly efficient, nearly ideal N-P-N surface barrier transistor is provided. Such a transistor has many unique advantages. These include the following: there is essentially a zero collector storage; there is essentially a unity emitter efficiency; and a very low saturation voltage. In addition, the frequency response is very high compared to prior art surface barrier transistor made of germanium, for example. That is, frequency response of a surface barrier transistor constructed in accordance with the present invention may be expected to exhibit a frequency response of from 1–2 orders of magnitude greater than that of prior art surface barrier transistors.

In addition, a low base resistance can be achieved without sacrificing emitter efficiency. The device may easily be fabricated employing present art techniques. Inasmuch as no significant heat treatment is involved in fabricating the device, no deleterious effects result, permitting the use of nearly perfect material with optimum electrical characteristics.

Inasmuch as indium arsenide has a small band gap (0.33) electron volts at room temperature, a surface barrier transistor constructed in accordance with the present invention would have to be cooled in order to operate. It will operate at a temperature below approximately 150° K. in a satisfactory manner but for best performance it should be operated at the temperature of liquid nitrogen (+77° K.).

The base doping level for the P-type indium arsenide crystal body for use in accordance with the present invention should be less than $5\times10^{16}$ atoms/cm.$^3$, i.e., $1\times10^{15}$ atoms/cm.$^3$; it is typically $1\times10^{16}$ atoms/cm.$^3$.

It is well known that the frequency response of any transistor is proportional to both the current density and the carrier mobility. It is also known that the dissipation is proportional to current density and the band gap of the semiconductor material. Thus a figure of merit for such a device is maximized if the mobility is high and the band gap is small. These two conditions clearly obtain for indium arsenide. Its band gap is 0.43 electrons (at 77° K.), while that of germanium is 0.68 (at 300° K.). Its mobility is 82,000 cm.$^2$/v. sec. (for electrons at 77° K.) while that of germanium is 1700 cm.$^2$/v. sec. (for holes at 300° K.). Therefore, a reasonable figure of merit for an indium arsenide transitor is 190,000 and that for germanium 2,500. It should be noted that this figure of merit compares the optimum transistor in both cases and does not include the more severe limitation associated with the germanium device whose characteristics are shown in FIGURE 3.

While such a low temperature somewhat limits the use of the present invention device, there are many advantages to operating such a device at a low temperature. Noise and surface conduction effects have been found to be greatly reduced over operation at room temperature. The carrier mobility is greatly increased, thus permitting a higher frequency response and lower parasitic base resistance. Operation at very high current density is also possible due to the efficient cooling and the lower power dissipation due to the small band gap. Operation of a present art transistor in conjunction with other cryogenic devices has long been envisioned but most present art transistors cease to function long before cryogenic temperatures are reached. Many photodetectors and other devices must operate at low temperatures. Therefore, an amplifier employing present invention transistors could be made an integral part of the detector with improved performance.

Figure 3:
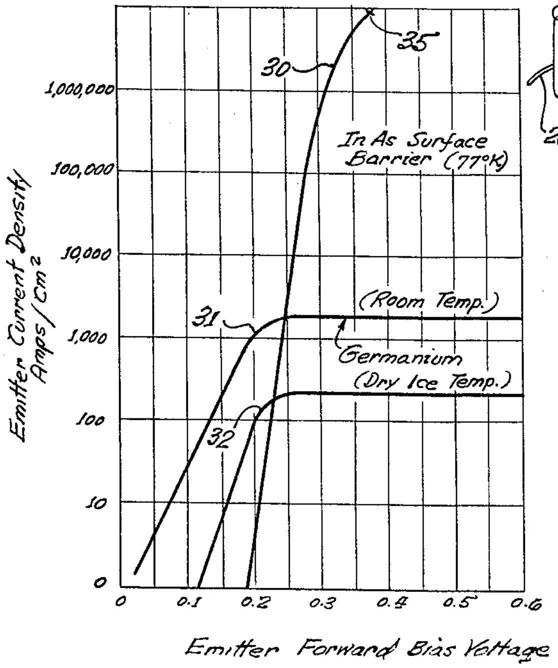
FIGURE 3 is a graph where the abscissa is the emitter bias voltage in volts and the ordinate is the current density in amps/cm.$^2$ comparing a germanium surface barrier transistor and one of indium arsenide.

There is shown in FIGURE 3 a graph comparing the emitter density in amps/cm.$^2$ for a typical indium arsenide surface barrier transistor (curve 30) operating at 77° K. with prior art germanium surface barrier transistors. Curve 31 shows that at room temperature that a germanium device may be expected to have a limiting emitter density of 2000 amps/cm.$^2$ while curve 32 indicates that a similar device operated at Dry Ice temperatures can typically have an emitter density of only 200 amps/cm.$^2$. This limitation is imposed by the position of the surface Fermi level in the forbidden gap. Note that curve 30, representative of a typical surface barrier transistor constructed in accordance with the present invention does not suffer a similar limitation and hence can, in principle, be operated at a current density approaching 10,000,000 amps/cm.$^2$.

Figure 4:
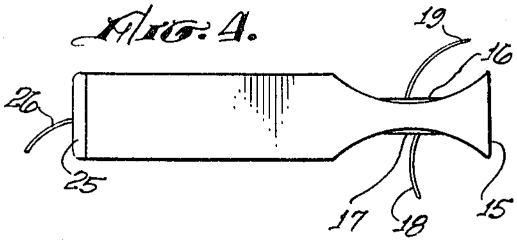
FIGURE 4 is a front elevation of a surface barrier transistor constructed in accordance with the present invention.
Figure 5:
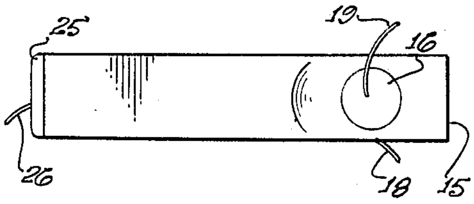
FIGURE 5 is a plan view of the transistor shown in FIGURE 4.

In FIGURES 4 and 5 there is shown a front elevation of a surface barrier transistor constructed in accordance with the presently preferred embodiment of this invention. Therein the base region 15 assumes a generally rectangular shape. Near one end thereof, the base region has its thickness substantially reduced in order to provide for close spacing between the metal barrier contacts 16 and 17 to which are attached electrodes 19 and 18 respectively. Finally, an electrode 26 is attached by a metallized layer or contact 25 to provide a base electrode.

Typical dimensions for the device shown in FIGURES 4 and 5 are as follows: the length is 0.150″, the width 0.050″ and the thickness 0.01″. The thickness of the base region in the vicinity of the barrier contacts 16 and 17 should be much less than the diffusion length of minority carriers in indium arsenide and is typically made to be from two to three microns. The diffusion length of minority carriers is less than thirty microns, as calculated from the book, Semiconducting III–V Componds by C. Hilsum and A. C. Rose-Ines, Pergamor Press, 1961, which gives typical minority carrier lifetime data on page 188 and minority carrier mobility data on page 122. This data, when used with well known equations for determining diffusion length, permits the determination of the noted diffusion length of less than thirty microns.

The reduced thickness in the vicinity of the barrier contacts may be produced by employing an electrolytic machining or etching process as described in the previously referenced article by Bradley. The metal barrier contacts may be established either by electro-plating, as is mentioned in said article, or by any other suitable means, such as vacuum evaporation. Almost any metal may be employed as the barrier contact. The only limitations placed upon the metals which may be used is a function of the technology to produce a thin layer in intimate contact with the semiconductor crystal body to which the electrode may be attached. Of course, the deposited metal contact electrodes should not alloy into the semiconductor body, else a short may result. Metals which have been found to be particularly satisfactory are: gold, tin, zinc, and cadmium. A typical thickness of the metal contact layer is from 5 to 10 mils.

The collector breakdown voltage which can be achieved in accordance with the present invention is typically 1 volt and may be made to be up to 7 volts, depending upon the doping of the base material. The doping of the base material is typically accomplished by zinc or cadmium which may be introduced during the growth of the crystal to a typical level of a few hundred parts/million of the parent material.

A typical frequency response of a prior art surface barrier transistor is of the order of 30 to 60 megacycles; the present invention on the other hand may operate in the vicinity from 20 to 30 kilomegacycles or higher.

The saturation voltage of the present invention device, as was previously mentioned, is very low compared to germanium devices. A typical value for a germanium device is one millivolt while the present invention device may be expected to have a saturation voltage of less than 10 microvolts. The ohmic connection to the base region shown as 25 in FIGURES 3 and 4 may be produced by alloying zinc thereto or by employing a zinc solder.

What is claimed is:

1. A surface barrier device comprising of a body of P-type conductivity indium arsenide, a metal material in area contact with a surface region of said body for injecting minority carriers into said body, and minority carrier collecting means in closely-confronting relationship to said metal material-area contact.

2. The device of claim 1, there being an additional contact on said body.

3. The device of claim 1, said body having a thickness between said metal material-area contact and said collecting means of less than thirty microns.

4. The device of claim 3, said thickness being approximately three microns.

5. A surface barrier electrical translating device comprising a wafer of P-type conductivity indium arsenide, metal contacts on said wafer, and biasing means to said metal contacts for producing a current density substantially in excess of 2,000 amps/square centimeters.

6. A surface barrier transistor as defined in claim 1 having a doping level of said body which is less than $5 \times 10^{16}$ atoms/cm.$^3$.

References Cited by the Examiner

UNITED STATES PATENTS

| | | | |
|---|---|---|---|
| 2,956,217 | 10/1960 | Meyerhorer | 317—235 |
| 3,059,123 | 10/1962 | Pfann | 307—88.5 |
| 3,028,500 | 4/1962 | Wallmark | 250—211 |
| 3,049,622 | 8/1962 | Ahlstrom | 250—211 |

OTHER REFERENCES

Stern and Talley, Phys. Rev., 100, 1638 (1955).

JOHN W. HUCKERT, *Primary Exmainer.*

M. EDLOW, *Assistant Examiner.*